United States Patent [19]
Knee

[11] Patent Number: 6,037,889
[45] Date of Patent: Mar. 14, 2000

[54] METHOD TO ENHANCE THE SPEED AND IMPROVE THE INTEGRAL NON-LINEARITY MATCHING OF MULTIPLE PARALLEL CONNECTED RESISTOR STRING BASED DIGITAL-TO-ANALOG CONVERTERS

[75] Inventor: Derek L. Knee, Ft. Collins, Colo.

[73] Assignee: Hewlett-Packard Company, Palo Alto, Calif.

[21] Appl. No.: 09/033,548

[22] Filed: Mar. 2, 1998

[51] Int. Cl.[7] .................................................... H03M 1/68
[52] U.S. Cl. ........................................... 341/154; 341/144
[58] Field of Search .................................... 341/144, 145, 341/154

[56] References Cited

U.S. PATENT DOCUMENTS

| | | | |
|---|---|---|---|
| 5,059,978 | 10/1991 | Valdenaire | 341/144 |
| 5,627,537 | 5/1997 | Quinlan et al. | 341/144 |

*Primary Examiner*—Howard L. Williams

[57] ABSTRACT

An apparatus and method, which improves both the matching of the integral non-linearity of multiple resistor-string based DACs connected in parallel between two different reference voltages and the charge/discharge time of the parasitic capacitances associated with middle nodes of the DAC resistor strings, is presented. In a device where a plurality of DACs are connected in parallel between a first reference voltage and a second reference voltage, and each DAC is implemented using a plurality of resistors coupled in series between the two reference voltages, the resistor string in each DAC is partitioned into a plurality of subsets. A DAC node is located between each subset in each DAC, such that each DAC includes corresponding resistor subsets and corresponding DAC nodes. Each set of corresponding DAC nodes are respectively coupled to a different proportional reference voltage, which is maintained at a voltage level equal to the steady-state voltage potential across its respective corresponding DAC nodes and the first reference voltage. The different proportional reference voltages are implemented using either separate ideal voltage sources, or a master resistor string. The master resistor string, which comprises a plurality of series-connected resistors, is coupled between the first and second reference voltages. The master resistor string includes a corresponding master node for each of the different proportional reference voltages required, which provides a lower impedance path between the respective node and the two reference voltages.

13 Claims, 5 Drawing Sheets

6,037,889

METHOD TO ENHANCE THE SPEED AND IMPROVE THE INTEGRAL NON-LINEARITY MATCHING OF MULTIPLE PARALLEL CONNECTED RESISTOR STRING BASED DIGITAL-TO-ANALOG CONVERTERS

FIELD OF THE INVENTION

The present invention relates generally to digital-to-analog converters (DACs), and more particularly to improving integral non-linearity component mismatching between multi-stage parallel DAC devices.

BACKGROUND OF THE INVENTION

The reliance on digital-to-analog converters DACs has increased multifold as digital technology has permeated the electronics industry. Due to the ever increasing demand for higher performance electronics applications, a need exists for an accurate high-speed DAC.

A conventional DAC implementation employs a long resistor string (e.g., $2^n$ resistors) coupled in series between an upper and lower reference voltage. A n-by-$2^n$ decoder receives an n-bit digital input signal, and decodes it to select one of the $2^n$ output lines. Each successive one of the $2^n$ output lines is connected across each successive one of the $2^n$ resistors of the resistor string. The voltage level seen across the selected output line of the multiplexer and the lower reference voltage is thus represented by $m/2^n - 1$, where m is the digital input value ranging from 0 to $2^n - 1$. The analog output voltage is measured between the upper node of the $m^{th}$ R-bit resistor in the resistor string and the lower reference voltage.

Devices which employ more than one resistor-string based DAC coupled in parallel are problematic. First, DACs rely on the values of their circuit components, typically resistors or capacitors, to form ratios that digitally represent the ratio of an input signal to a reference signal. As a result, the primary limitation on the accuracy that can be achieved in a multi-stage DAC device is the variation in the values of the individual DAC components. This variation, known as component mismatch, causes these ratios to deviate from their nominal values, which, in turn, produces errors in the analog representation of the output signal.

Second, the string of resistors limits the charging and discharging of the parasitic capacitances associated with the nodes positioned near the middle of the resistor string. Due to the parasitic capacitance of the device, a certain amount of time is required to charge and discharge the parasitic capacitances associated with the internal nodes of the DAC. The amount of charge/discharge time is greatest for those R-bit resistors positioned close to the middle of the resistor string. In particular, for an 8-bit DAC, the worst case scenario occurs in the 256-resistor string around those resistors positioned near R-bit resistor 127 and R-bit resistor 128 in the string. The DAC output settling time when converting input digital codes having a value close to $2^n/2$ is increased due to this effect.

Accordingly, a need exists for a method of improving the INL component mismatching in multi-stage parallel resistor-string based DAC devices. In addition, a need exists for a method of improving the charge/discharge time of the parasitic capacitances associated with middle nodes of the resistor string.

SUMMARY OF THE INVENTION

Accordingly, an apparatus and method, which improves both the matching of the integral non-linearity of multiple resistor-string based DACs connected in parallel between two different reference voltages and the charge/discharge time of the parasitic capacitances associated with middle nodes of the DAC resistor strings, is presented. The invention applies to devices having DACs connected in parallel between a first reference voltage and a second reference voltage, where each DAC is implemented using a plurality of resistors coupled in series between the two reference voltages. According to the invention, the resistor string in each DAC is partitioned into a plurality of subsets. A DAC node is located between each subset in each DAC, such that each DAC includes corresponding resistor subsets and corresponding DAC nodes. Each set of corresponding DAC nodes are respectively coupled to a different proportional reference voltage, which is maintained at a voltage level equal to the steady-state voltage potential across its respective corresponding DAC nodes and the first reference voltage. The different proportional reference voltages are implemented using either separate ideal voltage sources, or a master resistor string.

In an illustrative embodiment, a master resistor string, which comprises a plurality of series-connected resistors, is coupled between the first and second reference voltages. The master resistor string includes a corresponding master node for each of the different proportional reference voltages required. The voltage potential across each master node and the first reference voltage is equal to the respective proportional reference voltage that it corresponds to and represents. The combined resistance across each master resistor string node and the first reference voltage is lower than the combined resistance across its corresponding node in each DAC and the first reference voltage. Furthermore, the combined resistance across the master resistor string node and the second reference voltage is lower than the combined resistance across its corresponding node in each DAC and the second reference voltage. Preferably, the combined resistance of each subset of resistors is substantially equal to the combined resistance of each other subset and each subset comprises a mutually-exclusive set of resistors in each DAC resistor string.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION OF THE INVENTION

Figure 1:
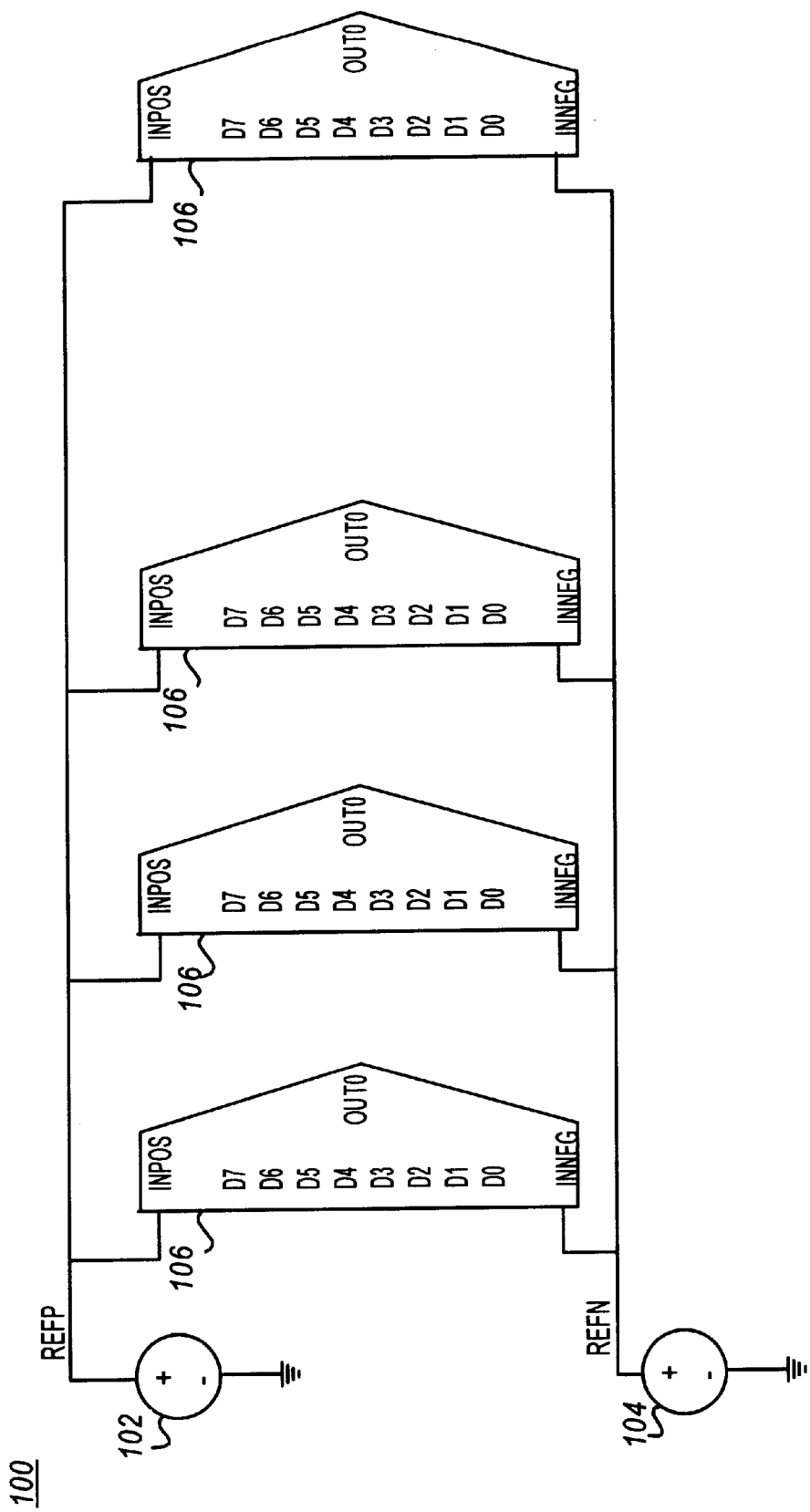
FIG. 1 is a schematic diagram of a prior art multi-stage DAC.

FIG. 1 is a schematic diagram of a prior art multi-stage parallel digital-to-analog converter (DAC) device 100. DAC device 100 includes a plurality of 8-bit DACs 106 coupled in parallel between a first reference voltage REFP 102 and a second reference voltage REFN 104.

Figure 2:
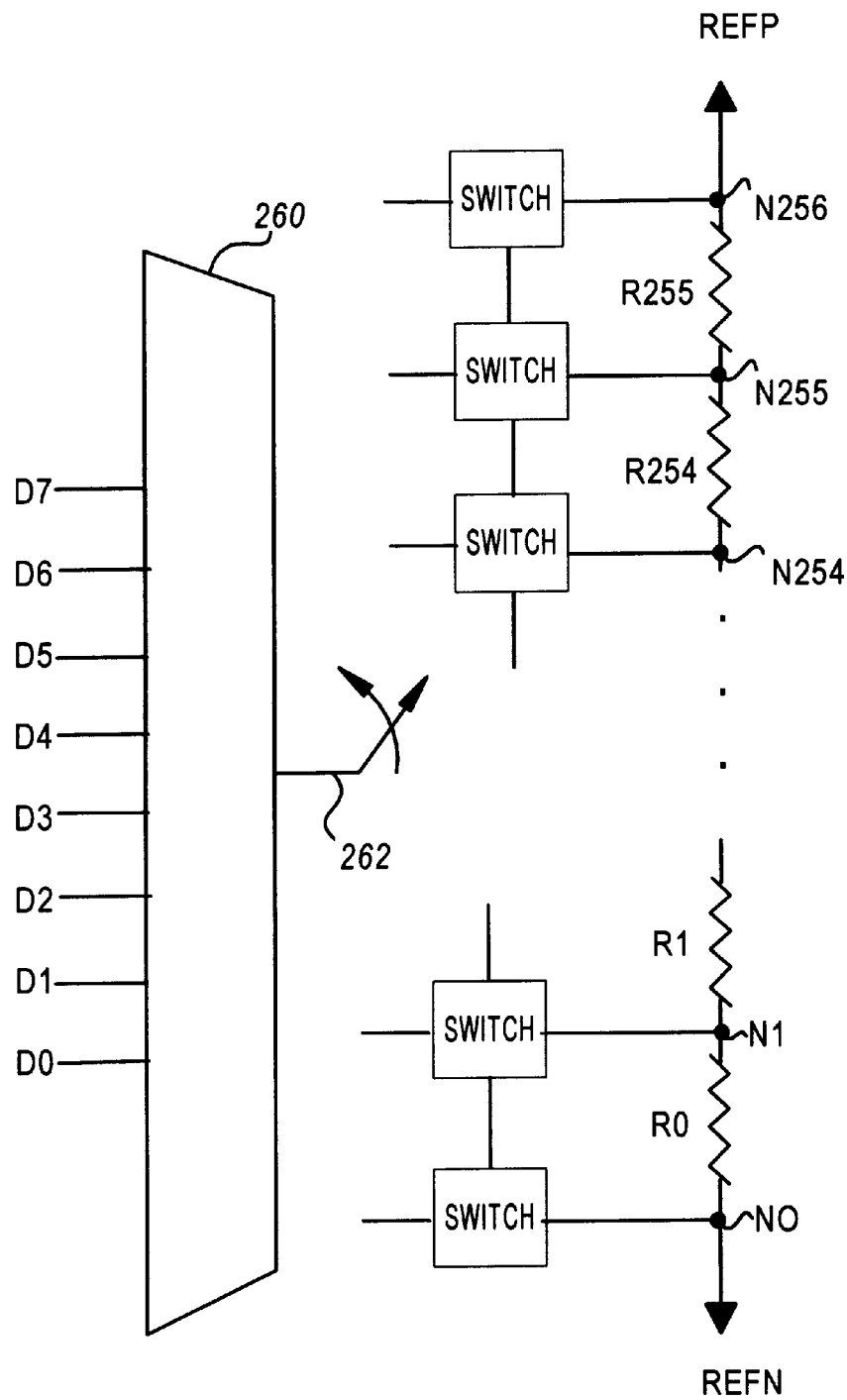
FIG. 2 is a schematic diagram of one embodiment of a resistor-string based DAC.

FIG. 2 is a schematic diagram of the internals of one embodiment of an 8-bit DAC 200 used to implement DAC 106. In this embodiment, DAC 200 comprises 256 resistors R0–R255 coupled in series between first reference voltage REFP 102 and second reference voltage REFN 104. DAC 200 includes an 8-by-256 multiplexer 260 which accepts eight digital inputs D0–D7. Resistor string 120 includes nodes N0 through N255 corresponding to the nodes at each end of each R-bit resistor, beginning with R-bit resistor R0 and ending with R-bit resistor R255, as illustrated. For example, node N32 is located between resistor R31 and R32, node N64 is located between resistor R63 and R64, node N96 is located between resistor R95 and R96, node N128 between resistor R127 and R128, node N160 between resistor R159 and R160, node N192 between resistor R191 and R192, and node N224 between resistor R223 and R224. Multiplexer 260 connects the analog output 262 to node Nxxxxxxxx$_{bin}$, where xxxxxxxx$_{bin}$ is the value of the binary digital inputs D0–D7. The analog output voltage $V_{A\_OUT}$ on analog output 262 is measured between the connected node Nxxxxxxxx$_{bin}$ and the lower reference voltage REFN 104. The analog output voltage $V_{A\_OUT}$ therefore reflects a fraction m/256 of the full potential voltage (REFP–REFN), where m is the value represented by digital inputs D0–D7. Accordingly, if digital inputs D0–D7 have a value of 0 (00000000$_{bin}$), $V_{A\_OUT}$ is measured across node N0 and REFN and its value is 0 volts; if digital inputs D0–D7 have a value of 1 (00000001$_{bin}$), $V_{A\_OUT}$ is measured across node N1 and REFN and its value is 1/256(REFP–REFN); if digital inputs D0–D7 have a value of 128 (10000000$_{bin}$), $V_{A\_OUT}$ is measured across node N128 and REPN and its value is 128/256(REFP–REFN); if digital inputs D0–D7 have a value of 255 (11111111$_{bin}$), $V_{A\_OUT}$ is measured across node N255 and REFN and its value is 255/256(REFP–REFN), and so forth.

One problem in multiple-stage parallel DAC device 100 which arises from the use of a long resistor string as illustrated by DAC 200 is the difficulty in accurately matching the output impedance of each DAC 106 with each other DAC 106. INL component mismatching arises from the requirement to accurately match the 256 R-bit resistor string within one DAC, which is difficult to match within itself alone, to the 256 R-bit resistor string in the other DACs which are connected in parallel across REFP and REFN.

Figure 5:
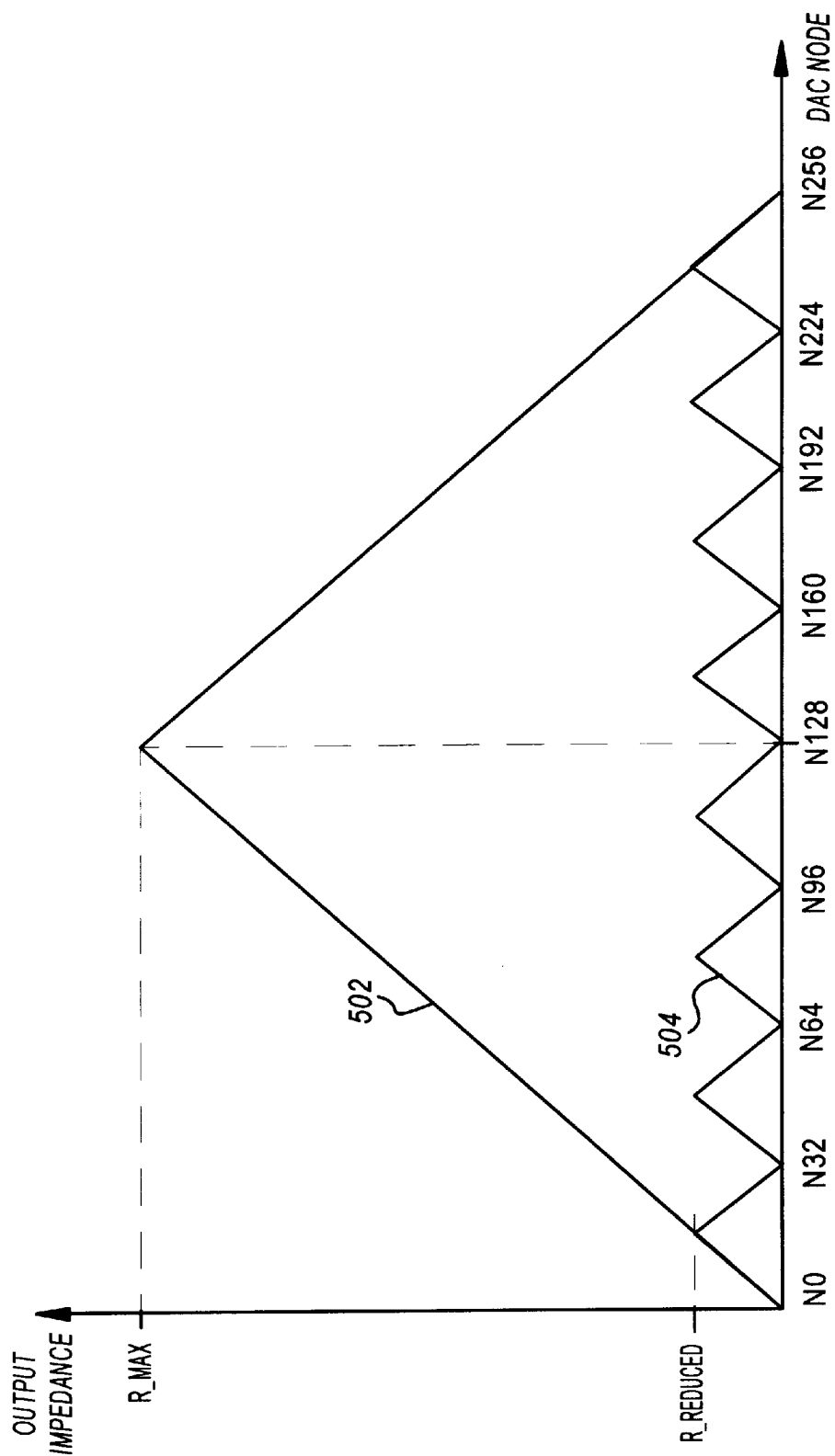
FIG. 5 is a graph of the output impedance versus internal resistor node number for multi-stage parallel DAC devices with and without application of the present invention.

Another problem which occurs in multiple-stage parallel DAC structure 100 is the dependence of the charging time on the position of the selected resistors R0–R255 as determined by the digital input signal. Each R-bit resistor incurs a natural parasitic capacitance inherent in the circuit due to the fabrication process. When DACs 106 operate at high speed, the internal output of the internal switches must change very quickly. However, the value on internal nodes N0–N255 switch only as fast as they can be charged via REFP or discharged via REFN. Accordingly, an inherent charge/discharge delay results due to the charging or discharging of this parasitic capacitance. The delay is longest for the internal nodes at or close to the middle of the resistor string (i.e., nodes N127 and N128 in a 256-R-bit resistor string). Thus, the highest output impedance, and therefore longest settling time, occurs when the digital input signal corresponds to the mid-point of its highest possible value, that is, when D0–Dn has a value of $2^n/2$. FIG. 5, curve 502 illustrates the theoretical output impedance of a resistor-string based DAC without application of the present invention versus the internal node of the resistor string. The speed improvement issue arises from the finite time required to charge and discharge the parasitic capacitances associated with the internal R-bit nodes N0–N255 of the DAC and the output multiplexer 260. In particular for an eight-bit DAC, the worst case scenario occurs in the 256 series resistor string. This string of resistors limits the charging and discharging of the parasitic capacitances associated with the nodes around R-bit R128. The DAC output settling time when converting input digital codes around midscale, is increased due to this effect.

Figure 3:
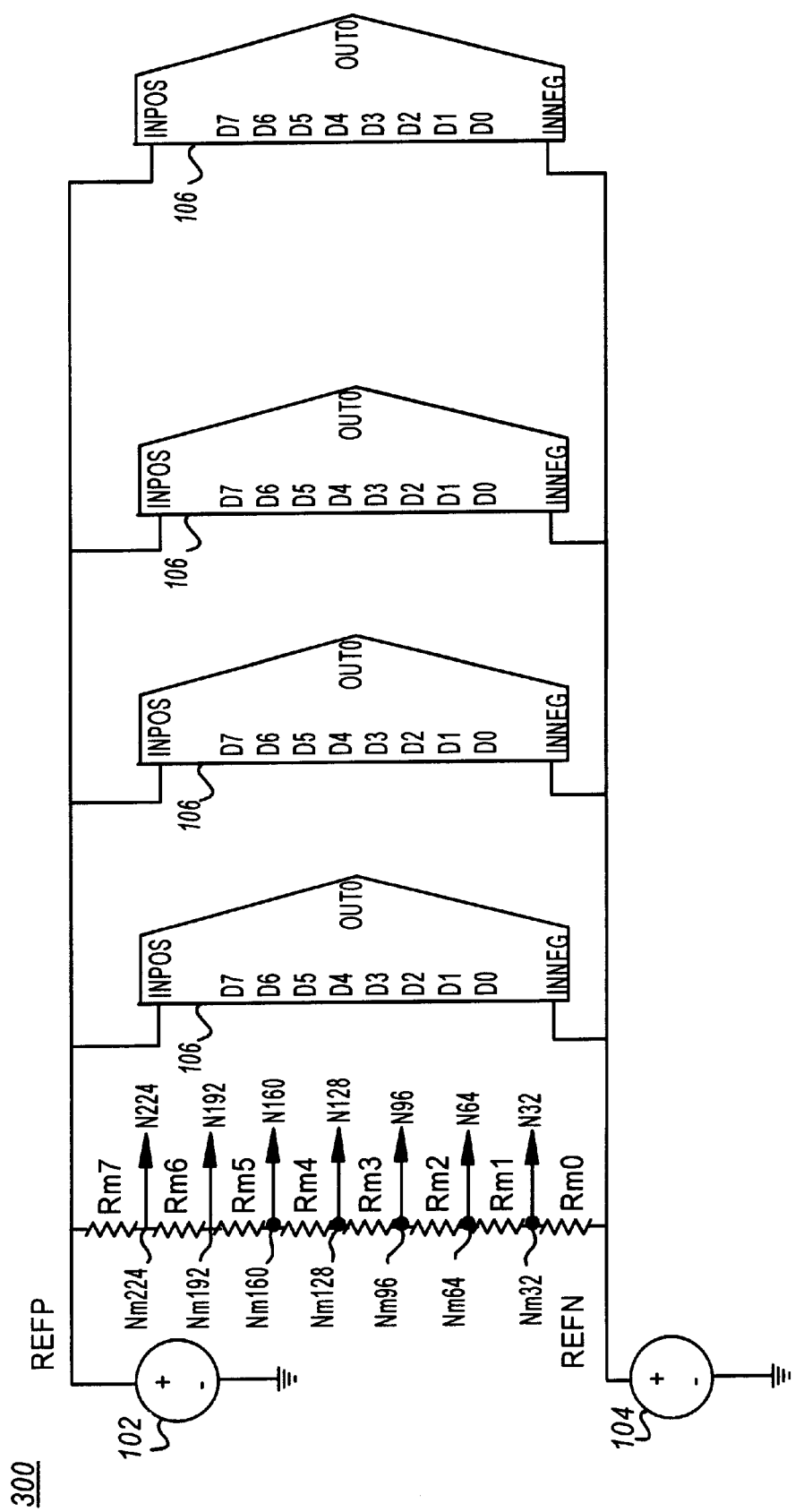
FIG. 3 is a schematic diagram of a multi-stage parallel DAC device in accordance with the invention.

FIG. 3 is a schematic diagram of an apparatus in accordance with the invention for improving the matching of the integral non-linearity (INL) between DACs in a device comprising multiple parallel resistor-string based DACs. The improved device, shown at 300, includes a plurality of DACs 106 coupled in parallel between a first reference voltage REFP 102 and a second reference voltage REFN 104. Each DAC 106 is implemented with a resistor string comprising a plurality of resistors R0–R255 coupled in series between first reference voltage REFP 102 and second reference voltage REFN 104, such as illustrated by DAC 200. Device 300 also includes a master resistor string 320 comprising resistors $R_M0$, $R_M1$, $R_M2$, $R_M3$, $R_M4$, $R_M5$, $R_M6$ and $R_M7$ coupled in series between first reference voltage REFP 102 and second reference voltage REFN 104. Master resistor string 320 includes node $N_M32$ between resistor $R_M0$ and $R_M1$, node $N_M64$ between resistor $R_M1$ and $R_M2$, node $N_M96$ between resistor $R_M2$ and $R_M3$, node $N_M128$ between resistor $R_M3$ and $R_M4$, node $N_M160$ between resistor $R_M4$ and $R_M5$, node $N_M192$ between resistor $R_M5$ and $R_M6$, and node $N_M224$ between resistor $R_M6$ and $R_M7$. Nodes N32, N64, N96, N128, N160, N192, and N224 of each of DACs 106 are connected, respectively, in parallel to respective nodes $N_M32$, $N_M64$, $N_M96$, $N_M128$, $N_M160$, $N_M192$, and $N_M224$ of master resistor string 320. Master resistor 320 is therefore connected in parallel with eight subsets of 32 R-bit resistors within each DAC 106. This establishes an alternative, lower impedance path to the "center" of the resistor strings within the DACs 106, thus reducing the charge/discharge rate of the internal parasitic node capacitances. Another advantage served by master resistor string 320 is that by connecting each corresponding matching node together (e.g., V32, V64, V96, V128, V160, V192, V224 of each DAC 106), any mismatch in the long 256-Rbit resistor strings within each DAC 106 are averaged out, resulting in each of DACs 106 approaching a single INL component mismatch value, which improve their matching.

FIG. 5, curve 504 illustrates the output impedance of a resistor-string based DAC with application of the present invention versus the internal node of the resistor string. As shown, the maximum output impedance is significantly reduced and has peaks at the nodes in the midpoint between each commonly coupled node which is coupled to the master resistor string. Thus, the output impedance is lowest at nodes N0, N32, N64, N96, N128, N160, N192, N224 and N256, and highest at nodes N16, N48, N80, N112, N144, N176, N108, and N240, yet the maximum output impedance has been significantly reduced.

One method of implementing resistor string 220 in DAC 200 is as a long narrow resistor cell, with nodes N0–N255 evenly distributed along the length of the cell. Due to the space required to implement a resistor on an integrated circuit, and from a chip layout point of view, it is generally not practical to implement long resistor strings as one long narrow cell. Instead, resistor strings are typically folded back and forth in a snake-like configuration to achieve an X-by-Y array of resistors within a shorter but wider area of the chip. This configuration is not only more practical from the standpoint of chip layout, but it also allows fewer switches to be used to generate the equivalent analog output signal $V_{A\_OUT}$ for a given digital input signal D0–D7, at the cost of additional decoding.

Figure 4:
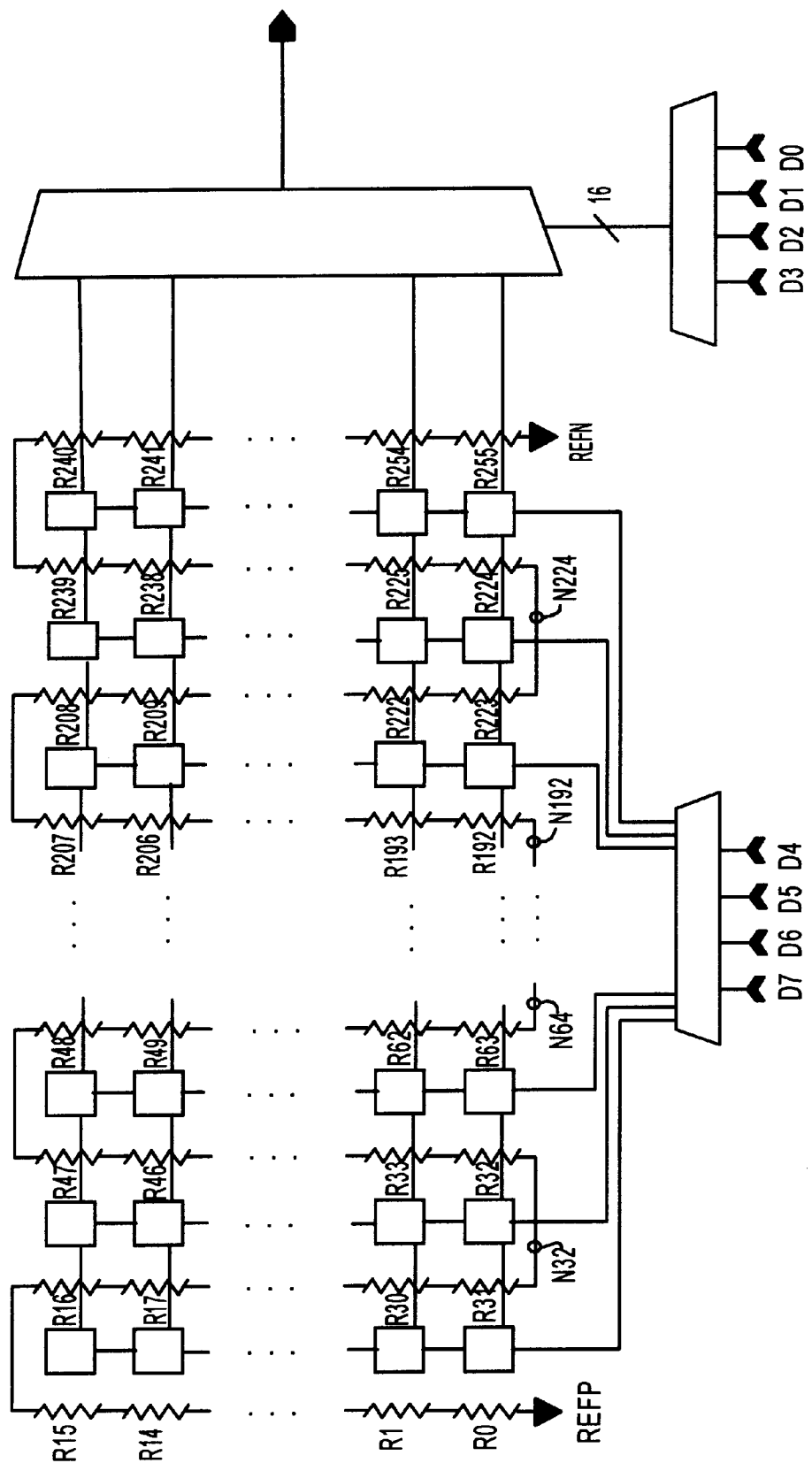
FIG. 4 is a schematic diagram of an alternative embodiment of a resistor-string based DAC.

FIG. 4 illustrates a schematic diagram of an alternative embodiment of DAC 106 which employs this resistor string configuration. In this embodiment, DAC 400 employs a resistor string 420 having a 16-leg-by-16-R-bit configuration (for a total of 256 R-bits). Nodes N32, N64, N96, N128, N160, N192 and N224 are accessible at the lower turns of the resistor string. By placing a switch S between each leg at each R-bit in each successive row of the 16-by-16 R-bit array, fewer switches are required. A 4-by-16 decoder 402 receives the upper four digital inputs D7, D6, D5, D4 to select a 16-R-bit set R0–R15, R16–R31, R32–R47, R48–R63, R64–R79, R80–R95, R96–R111, R112–R127, R128–R143, R144–R159, R160–R175, R176–R191, R192–R207, R208–R223, R224–R239, or R240–R255. The selected 16-R-bit set is fed into the analog inputs of a multiplexer 406. The analog inputs of multiplexer 406 are selected for output as $V_{A\_OUT}$ by 4-by-16 bit decoder 404. Decoder 404 receives the lower four digital inputs D3, D2, D1, D0 which selects which one of the 16 R-bits in the 16-R-bit set fed into multiplexer 406 are to be output as $V_{A\_OUT}$.

The use of DAC 400 as each DAC 106 in FIG. 3 does not change the advantages or theory of operation of the multi-stage DAC device 300 of FIG. 3. Nodes N32, N64, N96, N128, N160, N192, and N224 of each of DACs 106 are still connected, respectively, to respective nodes $N_M32$, $N_M64$, $N_M96$, $N_M128$, $N_M160$, $N_M192$, and $N_M224$ of master resistor string 320. Thus, an alternative, lower impedance path to the "center" of the resistor strings within the DACs 106 is established to improve inter-DAC component mismatching and reduce the charge/discharge rate of the internal parasitic node capacitances.

It will be appreciated by those skilled in the art that the implementation of the master resistor string solution is applicable to DACs which are designed to convert any number of digital bits. Furthermore, the number of resistors in the master resistor string can be adjusted depending on the configuration of the resistor string in each DAC 106. For example, in one integrated circuit chip design, it may only be convenient to provide a connection to the master resistor at the turns on one side of the resistor string (e.g., nodes N32, N64, N96, N128, N160, N192, and N224 of DAC 400). In this case, if the resistor string is configured with $2^n$ legs, only n nodes would be conveniently accessible, so master resistor string would comprise only n–1 lower-impedance resistors, yet still establishes an alternative, lower impedance path to the middle nodes of the resistor string within each DAC to thereby reduce the charge/discharge rate of the internal parasitic node capacitances. In either DAC embodiment 200 or 400, the master string resistor of the invention includes at least two resistors coupled in series between the upper reference voltage and the lower reference voltage. One of the resistors is coupled in parallel between a middle node of the resistor string of each DAC and the upper reference voltage, while the other resistor is coupled in parallel between the same or different middle node of the resistor string of each DAC and the lower reference voltage.

In an alternative embodiment of the invention, commonly connected nodes N32, N64, N96, N128, N160, N192 and N224 are coupled not to nodes $N_M32$, $N_M64$, $N_M96$, $N_M128$, $N_M160$, $N_M192$ and $N_M224$ of master resistor string 320, but instead to independent reference voltages which are proportional to the node number such that each independent reference voltage is represented by m/255 of the full potential voltage (REFP–REFN), where m is the number of the commonly coupled node. For example, node N32 of each DAC are coupled together and to a reference voltage of $^{32}/_{255}$(REFP–REFN); similarly, node N64 of each DAC are coupled together and to a reference voltage of $^{64}/_{255}$(REFP–REFN); and so forth.

A difficulty in employing independent reference voltages rather than the master resistor string 320 occurs when the reference voltages are generated on chip because it must be done without incurring any mismatch. The reason for this is that if each independent reference voltage has even a slight error tolerance, then each voltage source is not precisely proportional to one another. This distorts the voltages seen at the corresponding nodes in the resistor string of each DAC, resulting in an appearance that all the resistors of the resistor strings were mismatched. Accordingly, the master resistor string 320 is easier to implement since it is generally easier to match passive resistive components than it is voltage sources.

In the embodiments illustrated herein, the resistor string of each DAC 106 or 200 was partitioned into subsets of 32 R-bit resistors each. Furthermore, each subset of resistors included a mutually exclusive set of resistors. It will be appreciated by those skilled in the art that the DAC resistor strings may be partitioned into any number of subsets comprising any number of resistors, and which may or may not be mutually exclusive subsets. The essential element is that each DAC be partitioned identically and have equivalent corresponding nodes.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. An apparatus for improving the integral non-linearity matching of multiple resistor-string based digital-to-analog converters (DACs) connected in parallel between a first reference voltage and a second reference voltage, each DAC comprising a plurality of resistors coupled in series between said first reference voltage and said second reference voltage, comprising:

a first resistor coupled in parallel across said first reference voltage and a first subset of said plurality of resistors of each of said DACs, said first resistor having a lower resistance than the combined resistance of said first subset of said plurality of resistors of each of said DACs; and a second resistor coupled in series with said first resistor between said first reference voltage and said second reference voltage, and in parallel across said second reference voltage and a second subset of said plurality of resistors of each of said DACs, said second resistor having a lower resistance than the combined resistance of said second subset of said plurality of resistors of each of said DACs.

2. An apparatus in accordance with claim 1, wherein:

said combined resistance of said first subset of said plurality of resistors of each of said DACs is substantially equal to said combined resistance of said second subset of said plurality of resistors.

3. An apparatus in accordance with claim 1, comprising:

at least one intermediate resistor coupled in series between said first resistor and said second resistor, each intermediate resistor coupled in parallel with a corresponding intermediate subset of said plurality of resistors of each of said DACs, wherein each intermediate resistor has a lower resistance than the combined resistance of its corresponding intermediate subset of said plurality of resistors of each of said DACs.

4. An apparatus in accordance with claim 3, wherein:

the combined resistance of said first subset, said second subset, and each of said intermediate subsets of said plurality of resistors of each of said DACs is substantially equivalent.

5. An apparatus in accordance with claim 3, wherein:

said first subset, said second subset, and each of said intermediate subsets of said plurality of resistors of each of said DACs are mutually-exclusive sets of said plurality of resistors.

6. A multiple-stage parallel digital-to-analog converter (DAC) device, comprising:

a first reference voltage;

a second reference voltage;

a plurality of resistor-string based DACs connected in parallel between said first reference voltage and said second reference voltage, each DAC comprising:

a plurality of resistors coupled in series between said first reference voltage and said second reference voltage, said plurality of resistors being partitioned into a plurality of subsets;

a respective DAC node located between each of said plurality of subsets; and at least one different proportional reference voltage, each corresponding to a different one of said DAC nodes in any given DAC yet the same corresponding node in each of said plurality of DACs, and each coupled to its corresponding DAC node in each of said DACs, and each different proportional reference voltage having a voltage potential equivalent to an ideal voltage potential across said corresponding DAC node of each DAC and said first reference voltage.

7. A device in accordance with claim 6, wherein:

each of said at least one different proportional reference voltages is generated by a voltage source.

8. A device in accordance with claim 6, comprising:

a master resistor string coupled between said first reference supply voltage and said second reference supply voltage, said master resistor string comprising:

a plurality of master resistors coupled in series between said first reference supply voltage and said second reference supply voltage; and a different master node corresponding to each of said different proportional reference voltages, each different master node having a voltage potential matching its corresponding proportional reference voltage and being coupled to said respective DAC node in each of said DACs which corresponds to said respective corresponding proportional reference voltage;

wherein a combined resistance across each master resistor string node and said first reference voltage is lower than said combined resistance across its corresponding node in each of said DACs and said first reference voltage, and a combined resistance across said master resistor string node and said second reference voltage is lower than the combined resistance across its corresponding node in each of said DACs and said second reference voltage.

9. A device in accordance with claim 6, wherein:

each of said subsets of said plurality of resistors of each of said DACs has a substantially equivalent combined resistance.

10. A device in accordance with claim 9, wherein:

each of said plurality of subsets of said plurality of resistors of each of said DACs comprises a mutually-exclusive set.

11. A method to improve the integral non-linearity matching of a multiple-stage parallel resistor-string based digital-to-analog converter (DAC) device, said device comprising a plurality of DACs connected in parallel between a first reference supply voltage and a second reference supply voltage, each DAC comprising a plurality of resistors coupled in series between said first reference supply voltage and said second reference supply voltage, comprising:

partitioning each of said resistor strings of each of said DACs into a plurality of subsets;

coupling a different proportional reference voltage to respective nodes located between each of said plurality of subsets of each of said DACs, each different reference voltage representing the voltage potential across the node it is coupled to and said first reference voltage.

12. A method in accordance with claim 11, wherein:

implementing each of said different proportional reference voltages with a voltage source.

13. A method in accordance with claim 11, comprising:

implementing each of said different proportional reference voltages by:

coupling a master resistor string between said first reference supply voltage and said second reference supply voltage, said master resistor string comprising a plurality of master resistors coupled in series between said first reference supply voltage and said second reference supply voltage, said master resistor string comprising a corresponding master node for each of said different proportional reference voltages, wherein:

each master node has a voltage potential across said master node which corresponds to the respective proportional reference voltage that it represents;

the combined resistance across each master resistor string node and said first reference voltage is lower than the combined resistance across its corresponding node in each of said DACs and said first reference voltage, and the combined resistance across said master resistor string node and said second reference voltage is lower than the combined resistance across its corresponding node in each of said DACs and said second reference voltage.

* * * * *